US009865574B2

(12) United States Patent
Huang et al.

(10) Patent No.: US 9,865,574 B2
(45) Date of Patent: Jan. 9, 2018

(54) ALIGNMENT IN THE PACKAGING OF INTEGRATED CIRCUITS

(71) Applicant: Taiwan Semiconductor Manufacturing Company, Ltd., Hsin-Chu (TW)

(72) Inventors: Kuei-Wei Huang, Hsin-Chu (TW); Chih-Wei Lin, Zhubei (TW); Wei-Hung Lin, Xinfeng Township (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 7 days.

(21) Appl. No.: 15/143,957

(22) Filed: May 2, 2016

(65) Prior Publication Data

US 2016/0247790 A1    Aug. 25, 2016

Related U.S. Application Data

(62) Division of application No. 13/922,130, filed on Jun. 19, 2013, now Pat. No. 9,343,386.

(51) Int. Cl.
| | |
|---|---|
| *H01L 25/10* | (2006.01) |
| *H01L 23/31* | (2006.01) |
| *H01L 23/498* | (2006.01) |
| *H01L 23/544* | (2006.01) |
| *H01L 25/00* | (2006.01) |
| *H01L 23/00* | (2006.01) |

(52) U.S. Cl.
CPC ........ *H01L 25/105* (2013.01); *H01L 23/3128* (2013.01); *H01L 23/49811* (2013.01); *H01L 23/544* (2013.01); *H01L 25/50* (2013.01); *H01L 23/49822* (2013.01); *H01L 23/49827* (2013.01); *H01L 24/73* (2013.01); *H01L 2223/5442* (2013.01); *H01L 2223/5448* (2013.01); *H01L 2223/54426* (2013.01); *H01L 2223/54486* (2013.01); *H01L 2224/0401* (2013.01); *H01L 2224/04042* (2013.01); *H01L 2224/131* (2013.01); *H01L 2224/16238* (2013.01);

(Continued)

(58) Field of Classification Search
CPC . H01L 2224/85121; H01L 2224/85122; H01L 2224/85123; H01L 2224/85125; H01L 2224/85127; H01L 2224/85129; H01L 2224/8513; H01L 2224/85132; H01L 2224/85136; H01L 2224/85138; H01L 23/544; H01L 2223/54426; H01L 2223/54486
USPC .......... 257/686, E21.505, E25.013, E21.504; 438/106, 109, 127, 126, 15
See application file for complete search history.

(56) References Cited

U.S. PATENT DOCUMENTS

| 6,420,790 B1 | 7/2002 | Koizumi |
| 7,642,662 B2 | 1/2010 | Kasuga |

(Continued)

FOREIGN PATENT DOCUMENTS

JP    2012256741    12/2012

*Primary Examiner* — Bilkis Jahan
*Assistant Examiner* — Victor Barzykin
(74) *Attorney, Agent, or Firm* — Slater Matsil, LLP

(57) ABSTRACT

A method includes aligning a top package to a bottom package using an alignment mark in the bottom package, and placing the top package over the bottom package, wherein the top package is aligned to the bottom package after the placing the top package over the bottom package. A reflow is then performed to bond the top package to the bottom package.

20 Claims, 10 Drawing Sheets

(52) U.S. Cl.
CPC ............... *H01L 2224/32225* (2013.01); *H01L 2224/48227* (2013.01); *H01L 2224/73265* (2013.01); *H01L 2224/81805* (2013.01); *H01L 2224/81815* (2013.01); *H01L 2224/81895* (2013.01); *H01L 2225/1023* (2013.01); *H01L 2225/1058* (2013.01); *H01L 2225/1082* (2013.01); *H01L 2924/1431* (2013.01); *H01L 2924/1432* (2013.01); *H01L 2924/1533* (2013.01); *H01L 2924/15311* (2013.01); *H01L 2924/1815* (2013.01); *H01L 2924/18161* (2013.01)

(56) References Cited

U.S. PATENT DOCUMENTS

| | | | |
|---|---|---|---|
| 7,884,472 B2 | 2/2011 | Chen et al. | |
| 8,841,783 B2* | 9/2014 | Wakiyama | H01L 21/563 257/797 |
| 2008/0160671 A1 | 7/2008 | Liang et al. | |
| 2008/0230887 A1* | 9/2008 | Sun | H01L 21/565 257/686 |
| 2009/0115070 A1* | 5/2009 | Tanaka | H01L 23/49575 257/777 |
| 2010/0171207 A1* | 7/2010 | Shen | H01L 21/4853 257/686 |
| 2010/0213591 A1* | 8/2010 | Ho | H01L 25/0657 257/686 |
| 2011/0117700 A1* | 5/2011 | Weng | H01L 21/56 438/109 |
| 2012/0021564 A1* | 1/2012 | Chen | H01L 24/92 438/108 |
| 2012/0025368 A1* | 2/2012 | Lin | H01L 21/563 257/737 |
| 2012/0127485 A1 | 5/2012 | Yamauchi | |
| 2012/0313265 A1 | 12/2012 | Yamanishi | |
| 2014/0374922 A1 | 12/2014 | Huang et al. | |

\* cited by examiner

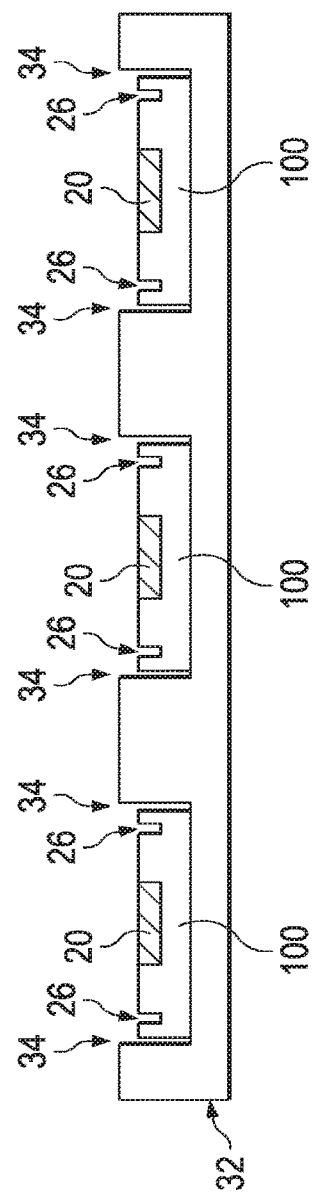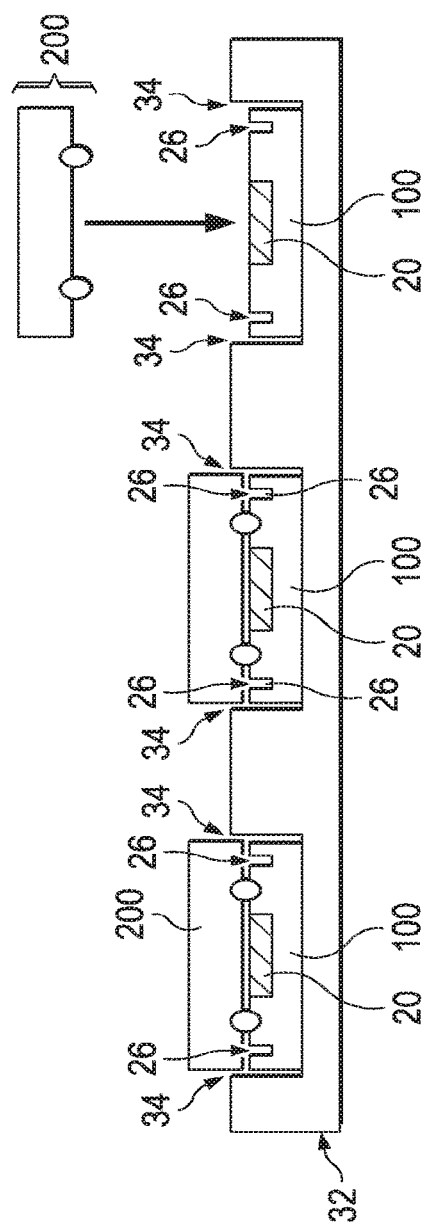

ALIGNMENT IN THE PACKAGING OF INTEGRATED CIRCUITS

PRIORITY CLAIM AND CROSS-REFERENCE

This application is a divisional of U.S. patent application Ser. No. 13/922,130, entitled "Alignment in the Packaging of Integrated Circuits," filed on Jun. 19, 2013, which application is incorporated herein by reference.

BACKGROUND

In a conventional Package-on-Package (PoP) process, a top package, in which a first device die is bonded, is bonded to a bottom package through solder balls. The bottom package may also include a second device die bonded therein. The second device die may be on the same side of the bottom package as the solder balls.

Before the bonding of the top package to the bottom package, a molding compound is applied on the bottom package, with the molding compound covering the second device die and the solder balls. Since the solder balls are buried in the molding compound, a laser ablation or drilling is performed to form holes in the molding compound, so that the solder balls are exposed. The top package and the bottom package may then be bonded through the solder balls in the bottom package.

In the bonding process, the solder balls in the top package need to be accurately aligned to the solder balls in the bottom package, so that the solder balls in the top package and the solder balls in the bottom package may be reflowed to join to each other. To perform the alignment, alignment marks are formed in the reflow boat, wherein bottom packages are placed in the openings in the reflow boat. The solder balls in the bottom packages are located through locating the alignment marks in the reflow boat. Alternatively, the solder balls in the top package and the solder balls in the bottom package are used as alignment marks.

The conventional alignment schemes suffer from drawbacks. For example, the process variation in the sawing of the bottom packages may cause the variation in the alignment of the solder balls. The surface of the solder balls may be oxidized, making the identification of the solder balls difficult.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 10 are cross-sectional views and top views of intermediate stages in the manufacturing of a Package-on-Package (PoP) in accordance with some exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Package-on-Package (PoP) structure and the method of forming the same are provided in accordance with various embodiments. The intermediate stages of forming the PoP structure are illustrated in accordance with some embodiments. The variations of the embodiments are discussed. Throughout the various views and illustrative embodiments, like reference numbers are used to designate like elements.

Figure 1:
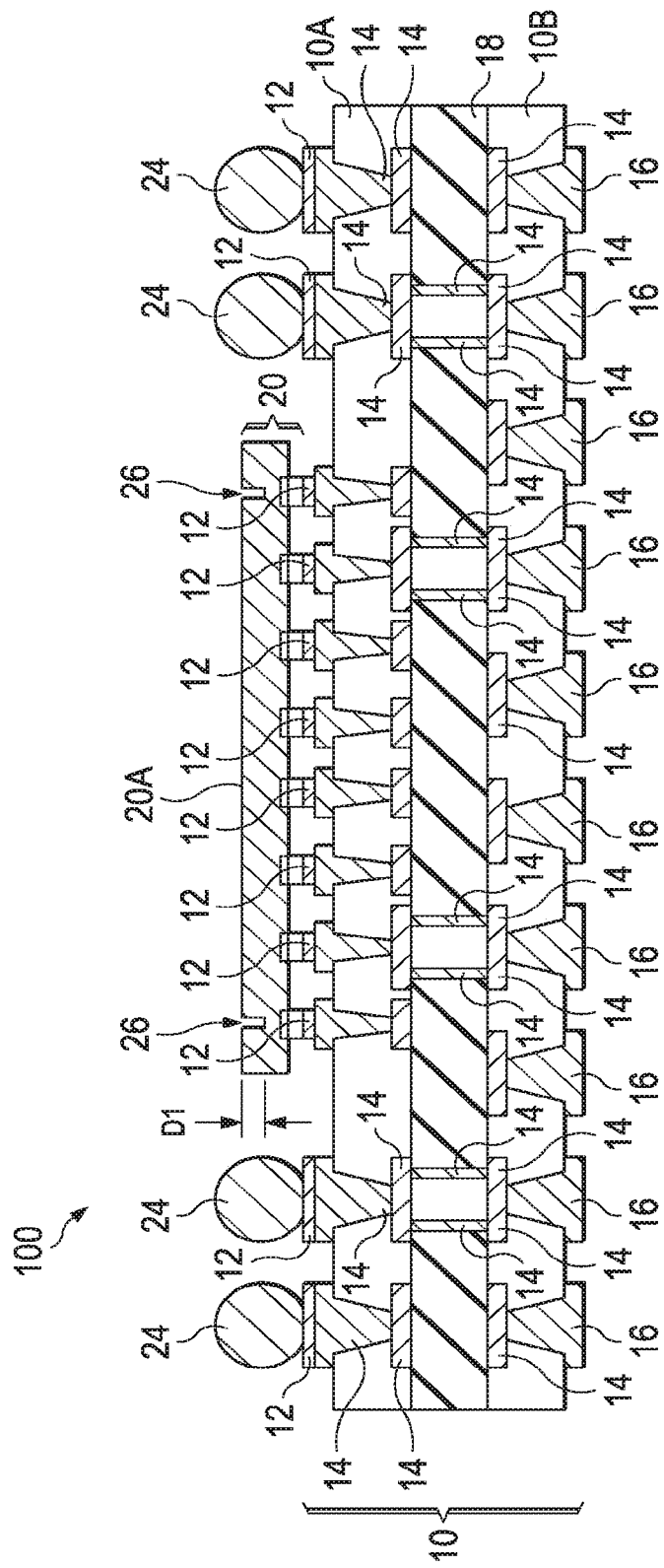

Referring to FIG. 1, bottom package 100 is formed, which includes package component 10. In some embodiments, package component 10 is package substrate, and hence throughout the description, package component 10 is referred to as package substrate 10, although it can be of other types. In alternative embodiments, package component 10 comprises an interposer. Package component 10 may be a part of a package component that includes a plurality of identical package components 10. For example, package component 10 may be a package substrate, and is located in an un-sawed package substrate strip that comprises a plurality of package substrates formed as an array.

Package substrate 10 may comprise substrate 18 that is formed of a dielectric material. Alternatively, substrate 18 may be formed of other materials such as a semiconductor material, for example, silicon. In some exemplary embodiments, package substrate 10 is a build-up substrate that is built on a core, as shown in FIG. 1. Alternatively, package substrate 10 is a laminate substrate which includes laminated dielectric films adhered together through lamination, wherein redistribution lines are embedded in the laminated dielectric films. When substrate 18 is formed of a dielectric material, the dielectric material may comprise composite materials that are mixed with glass fiber and/or resin.

Package substrate 10 is configured to electrically couple electrical connectors 12 at first surface 10A to conductive features 16 at second surface 10B, wherein surfaces 10A and 10B are opposite surfaces of package substrate 10. Electrical connectors 12 and conductive features 16 may be metal pads, for example, and hence are referred to as metal pads 12 and 16, respectively. Package substrate 10 may include conductive connections such as metal lines/vias 14, which may further comprise through-vias penetrating through substrate 18.

In some embodiments, electrical connectors 24 are formed at the top surface of package component 10. Electrical Connectors 24 may be electrically coupled to metal pads 12 and conductive features 16. In exemplary embodiments, electrical connectors 24 are solder balls. Alternatively, electrical connectors 24 may comprise metal pads, metal pillars, solder caps formed on metal pillars, and/or the like. In some embodiments, the top ends of electrical connectors 24 are higher than top surface 20A of die 20. Electrical connectors 24, when being solder balls, may comprise either eutectic solder or non-eutectic solder. In some embodiments, the formation of electrical connectors 24 includes a reflow process, wherein the solder-containing electrical connectors 24 are reflowed to form solder balls.

Also referring to FIG. 1, package component 20 is bonded to package substrate 10 through metal pads 12. Hence, bottom package 100, which includes package substrate 10 and package component 20, is formed. Package component 20 may be a device die, and is alternatively referred to as die 20 hereinafter, although it may also be another type of package component such as a package. Die 20 may include integrated circuit devices (not shown) such as transistors, capacitors, inductors, resistors, and/or the like. Furthermore, die 20 may be a logic circuit die such as a Central Computing Unit (CPU) die. The bonding of die 20 to metal pads 12 may be achieved through solder bonding or direct metal-to-metal bonding (such as copper-to-copper bonding).

In some embodiments, alignment marks 26 are pre-formed on the backside of die 20, which may be formed before the bonding of die 20 onto package substrate 10, for example, during the manufacturing of die 20 and before it is sawed from the respective wafer. Alternatively, alignment marks 26 are formed after the bonding of die 20 onto package substrate 10, and before the subsequently performed molding process. In the embodiments in which package component 20 is a device die, alignment marks 26 are formed on the backside of the respective semiconductor substrate (a silicon substrate, for example). Alignment marks 26 may be trenches that extend from the back surface of package component 20 into an intermediate level of (the silicon substrate of) package component 20. In some embodiments, depth D1 of alignment marks 26 is between about 15 μm and about 30 μm. It is appreciated, however, that the values recited throughout the description are merely examples, and may be changed to different values. Alignment marks 26 are used to mark the relative positions of electrical connectors 24. Since the relative positions of alignment marks 26 and electrical connectors 24 are fixed, by locating alignment marks 26, the positions of electrical connectors 24 may be determined. In alternative embodiments, no alignment mark is formed on the back surface of package component 20. Instead, alignment marks are formed in the subsequently formed molding material.

FIGS. 11A through 11I Illustrate the top views of a plurality of candidate alignment marks 26. Alignment marks 26 may have any top-view shapes, providing they can be identified. For example, FIGS. 11A, 11B, 11C, 11D, 11E and 11F illustrate a circle, a cross, a left double-square, a right double-square, a diamond, and a square, respectively. FIGS. 10G, 10H, and 10I illustrate that alignment marks 26 may have a grid shape (a double cross), a left diabolo shape, or a right diabolo shape, respectively.

Figure 2:
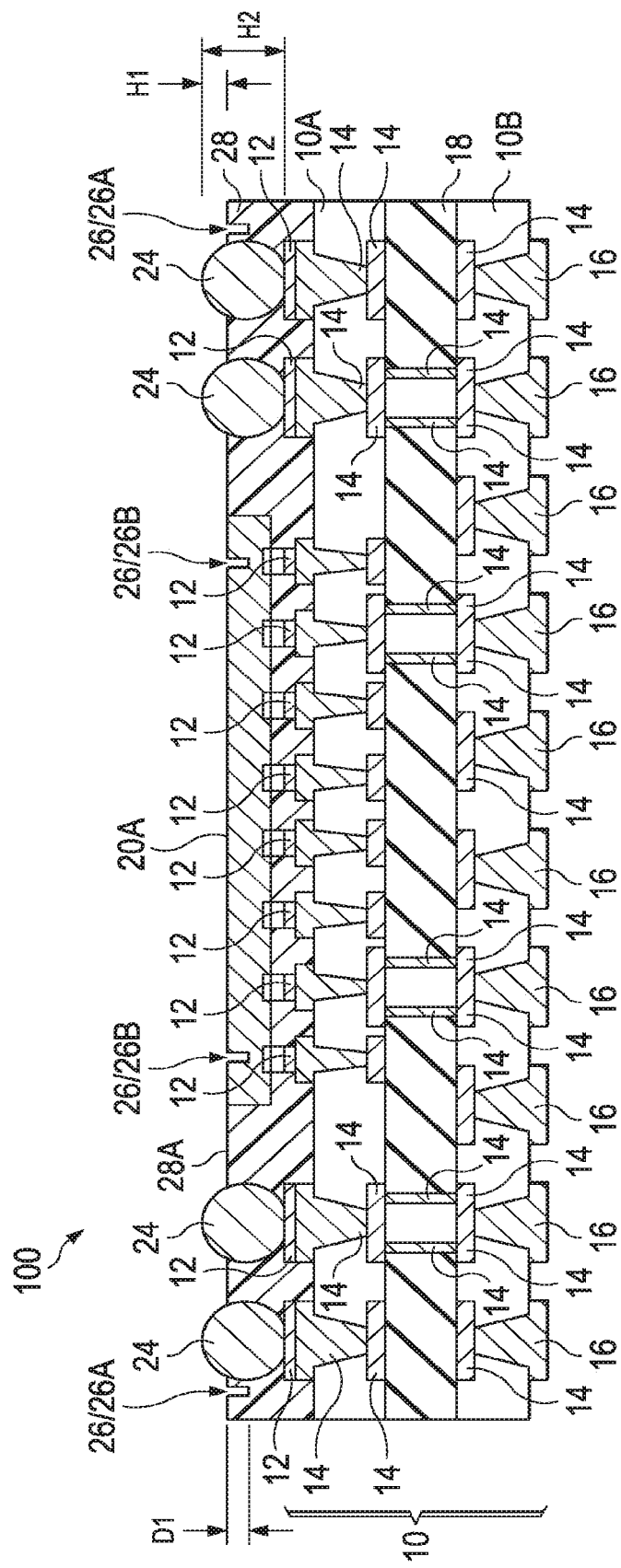

Referring to FIG. 2, molding material 28 is molded on bottom package 100. A curing process is performed after molding material 28 is dispensed. The top portions of electrical connectors 24 are over top surface 28A of molding material 28. In some exemplary embodiments, height H1 of the upper portions of electrical connectors 24 that are over top surface 28A is greater than about ¼, or greater than about ⅓, of height H2 of electrical connectors 24. Ratio H1/H2 may also be close to 0.5 in some embodiments. Molding material 28 may include a filler, a polymer, and a hardener in accordance with some embodiments. The polymer may be a molding compound, an underfill, a Molding Underfill (MUF), an epoxy, or the like.

Figure 4:
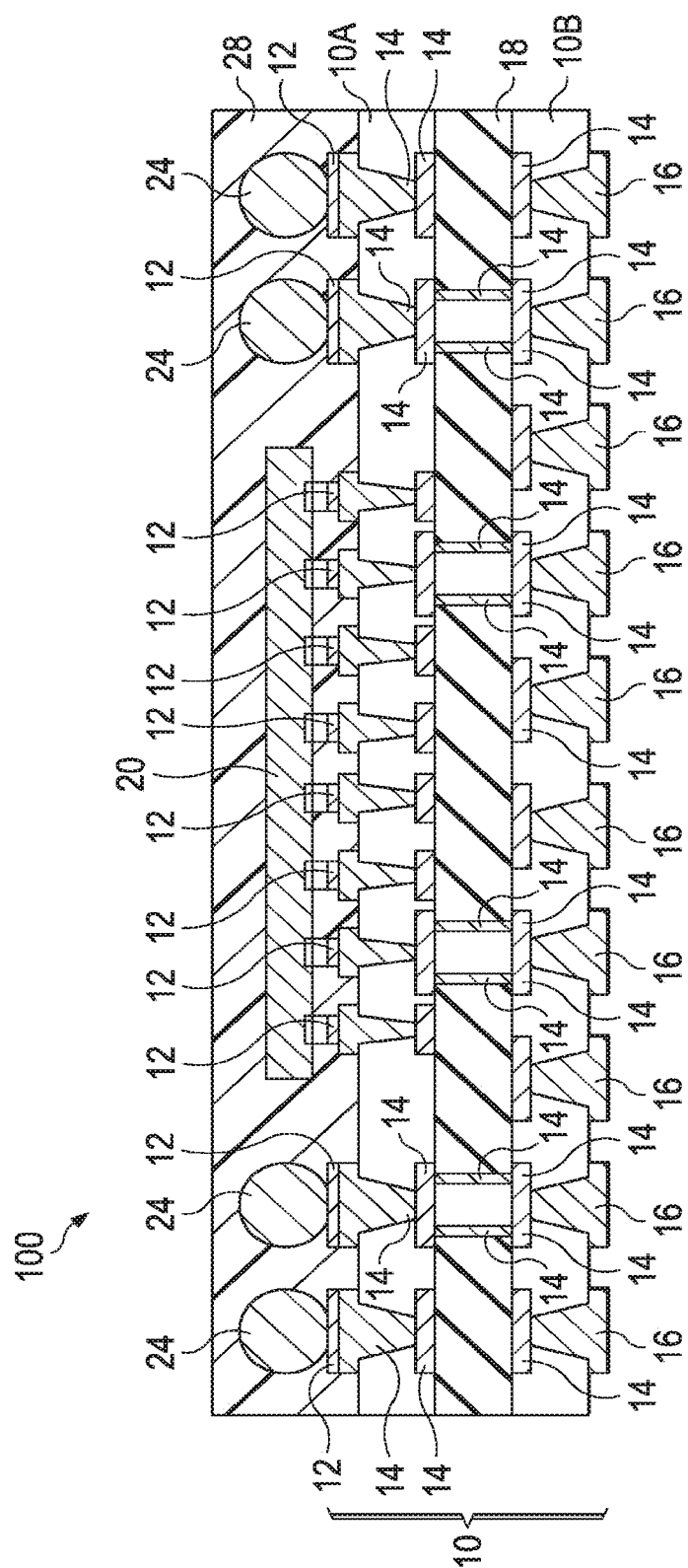

In some embodiments, as shown in FIG. 2, molding material 28 has its top surface 28A level with the top surface 20A of die 20, and hence die 20 is exposed through molding material 28. The alignment marks 26 (if any) in die 20 are thus exposed and can be identified. In alternative embodiments, molding material 28 may encircle and be in contact with the lower part of die 20, while the upper part of die 20 is over top surface 28A of molding material 28. The alignment marks 26 (if any) in die 20 are hence also exposed and can be identified. In alternative embodiments, as shown in FIG. 4, molding material 28 may fully encapsulate die 20 therein, with a portion of molding material 28 being overlapping die 20. In these embodiments, alignment marks are formed in molding material 28.

In accordance with some embodiments, alignment marks 26 are formed after the molding of molding material 28. Alignment marks 26 may be formed in molding material 28, wherein the respective alignment marks are shown as 26A. The locations of alignment marks 26 are selected to avoid the locations of electrical connectors 24, and can be in any position (in the top view) of molding material 28. Alignment marks 26 may be formed through laser drilling in some embodiments. The top-view shapes of alignment marks 26 may be selected from the exemplary shapes in FIGS. 11A through 11I, or may be any other shapes that can be distinguished. Alignment marks 26 (marked as 26B) may also be formed on the back surface of die 20 after the molding process.

Figure 3:
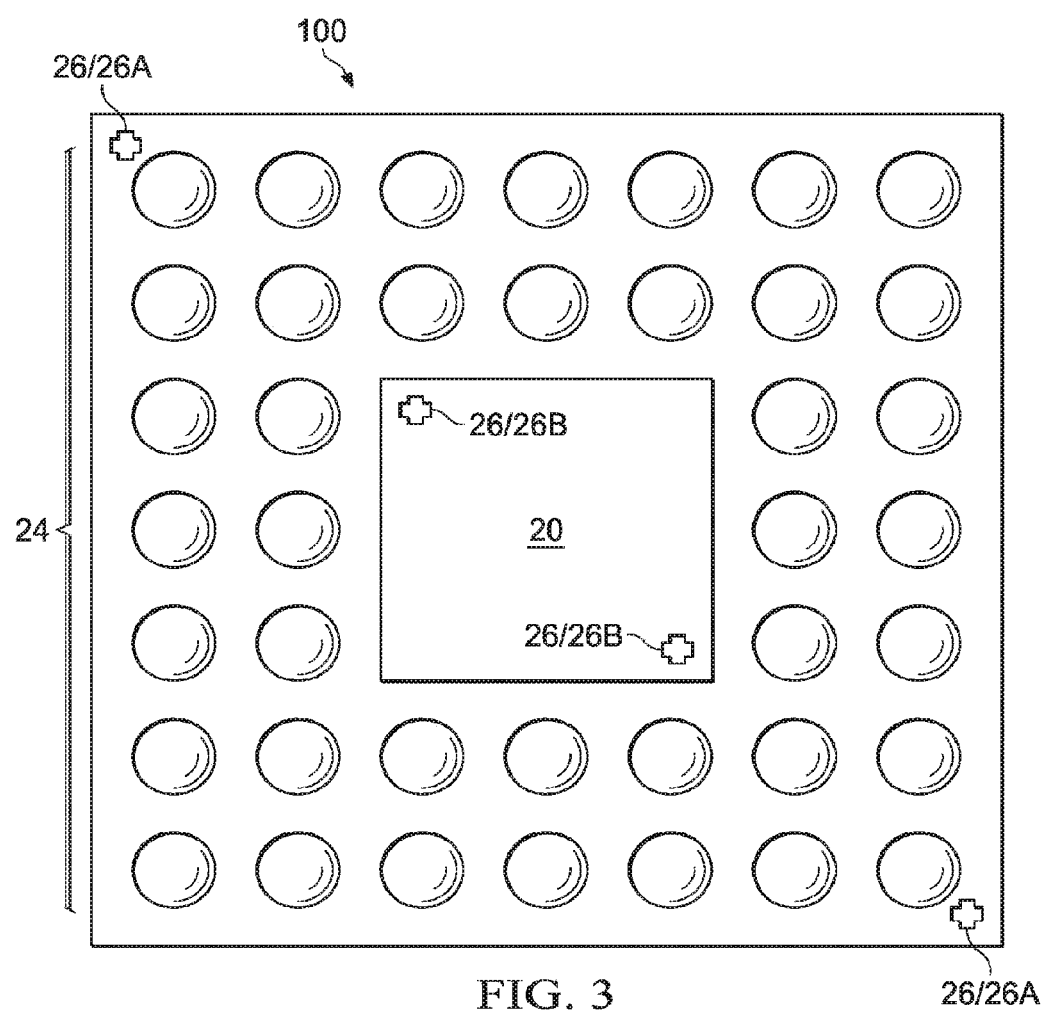

FIG. 3 illustrate an exemplary top view of bottom package 100. In accordance with some embodiments, electrical connectors 24 are formed to surround package component 20, although electrical connectors 24 may be formed with any other layout. In some embodiments, alignment marks 26 include portions 26A formed in molding material 28, and portions 26B formed in die 20. In alternative embodiments, alignment marks 26 include portions 26A but not portions 26B. In yet alternative embodiments, alignment marks 26 include portions 26B but not portions 26A.

Figure 5:
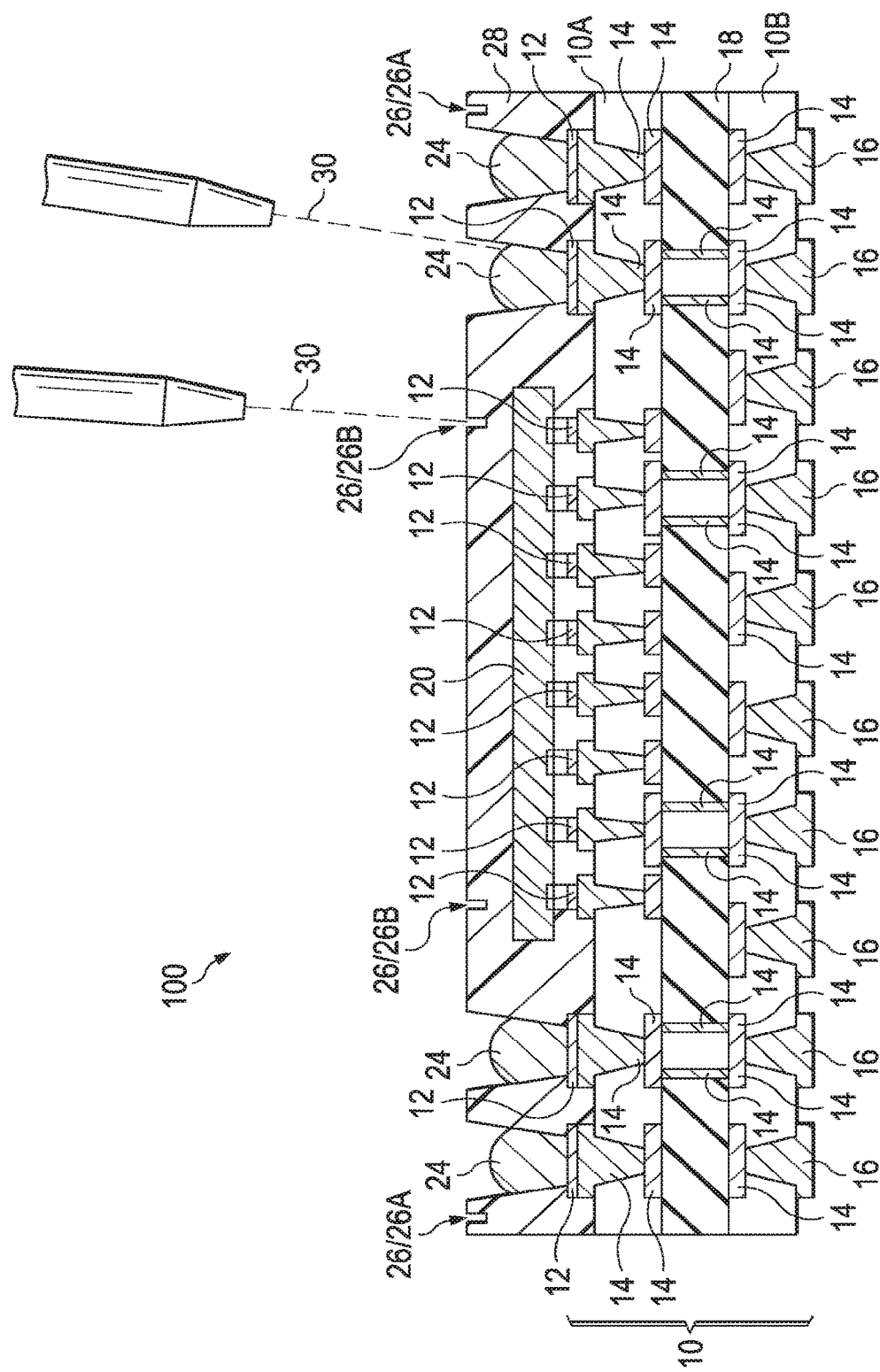

FIGS. 4 and 5 illustrate the formation of alignment marks 26 in accordance with alternative embodiments. In these embodiments, as shown in FIG. 4, molding material 28 fully covers die 20 and electrical connectors 24. Next, as shown in FIG. 5, the portions of molding material 28 that cover electrical connectors 24 are removed. The removal may be performed using laser 30, which burns the portions of molding material 28 covering electrical connectors 24. In addition, laser 30 is also used to form alignment marks 26, which extend from the top surface of molding material 28 into molding material 28. In these embodiments, alignment marks 26 may include portions 26A that are not directly over package component 20, and/or portions 26B that are directly over package component 20.

Figure 6:
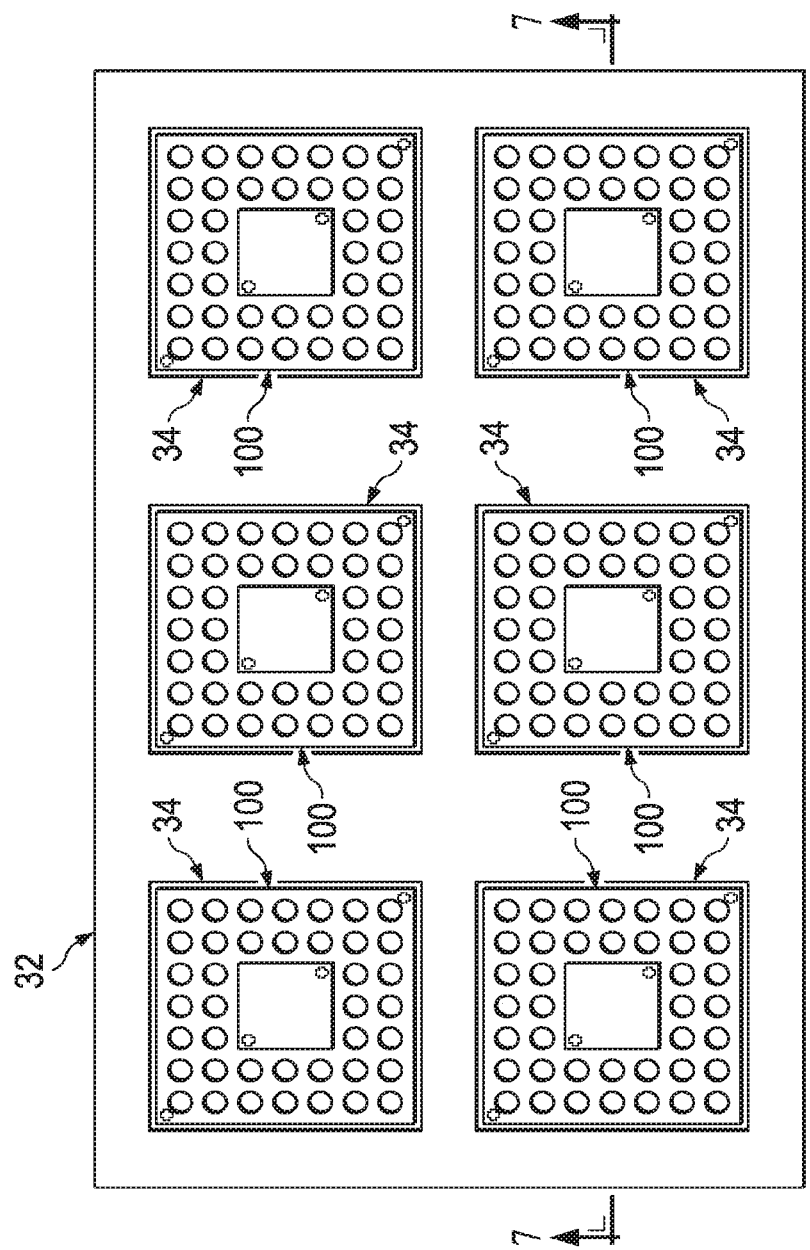

After the formation of bottom package 100, bottom package 100 is sawed from the respective package that includes a plurality of bottom packages. Bottom package 100 is placed into reflow boat 32, as shown in FIGS. 6 and 7, which illustrate a top view and a cross-sectional view, respectively. In some embodiments, reflow boat 32 includes plurality of openings 34 therein. Openings 34 are designed to accommodate bottom package 100 therein, wherein the top view size and shape of bottom package 100 is close to the top-view size and shape of the openings 34. FIG. 7 illustrates the cross-sectional view of reflow boat 32 and bottom packages 100, wherein the cross-sectional view in FIG. 7 is obtained from the plane crossing line 7-7 in FIG. 6. In FIG. 7, bottom packages 100 are schematically illustrated to show die 20 and some alignment marks 26. The remaining components of bottom packages 100 are not illustrated, and may be found referring to FIGS. 2, 3, and 5.

Figure 9:
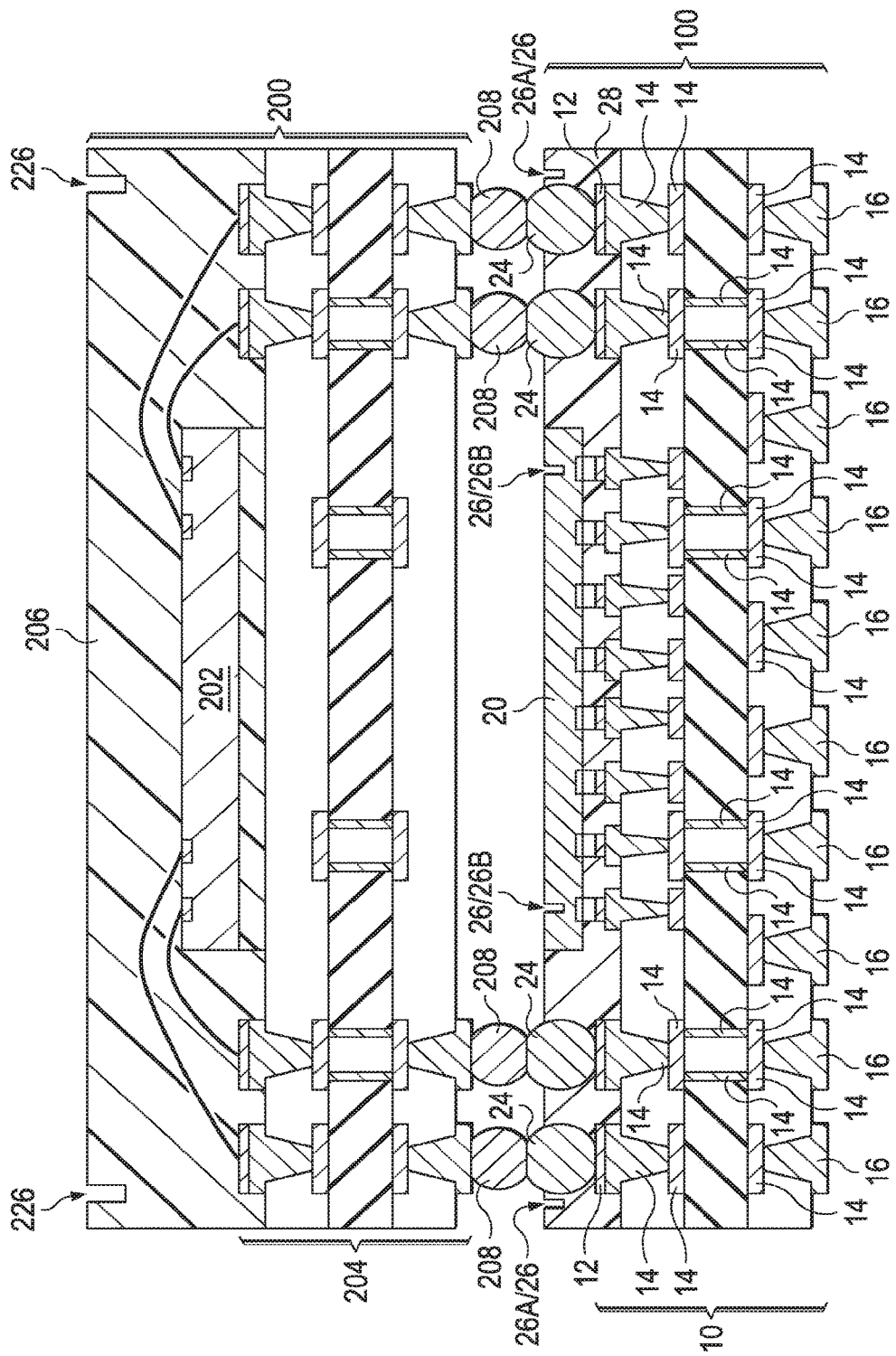

Next, referring to FIG. 8, top packages 200 are placed on bottom packages 100, which are located in reflow boat 32. FIG. 9 illustrates a magnified view of top package 200 and the respective bottom package 100. As shown in FIG. 9, top package 200 may be a package that includes device die 202 and package substrate 204, wherein device die 202 is bonded to package substrate 204. In some exemplary embodiments, device die 202 is a memory die such as a Static Random Access Memory (SRAM) die, a Dynamic Random Access Memory (DRAM) die, or the like. Furthermore, molding material 206 may be pre-molded on device die 202 and package substrate 204 before top package 200 is placed on bottom package 100.

In some embodiments, top package 200 includes solder balls 208 at the bottom surface of top package 200. Solder balls 208 need to be aligned to electrical connectors 24. The alignment is achieved through alignment marks 26, which is used to determine accurate locations of electrical connectors 24. In some embodiments, the determination of the positions of solder balls 208 is achieved by finding the positions of solder balls 208. In alternative embodiments, alignment marks 226 are made on the top surface of top package 200 for locating the positions of solder balls 208. The formation of alignment marks 226 may be similar to the formation of alignment marks 26, and hence the details are not repeated herein. In some embodiments, alignment marks 226 extend from the top surface of molding material 206 into molding material 206. In the embodiments wherein device die 202 is exposed through molding material 206, alignment marks may also be formed on the back surface (the illustrated top surface) of device die 202, and extends into the substrate of device die 202.

Figure 10:
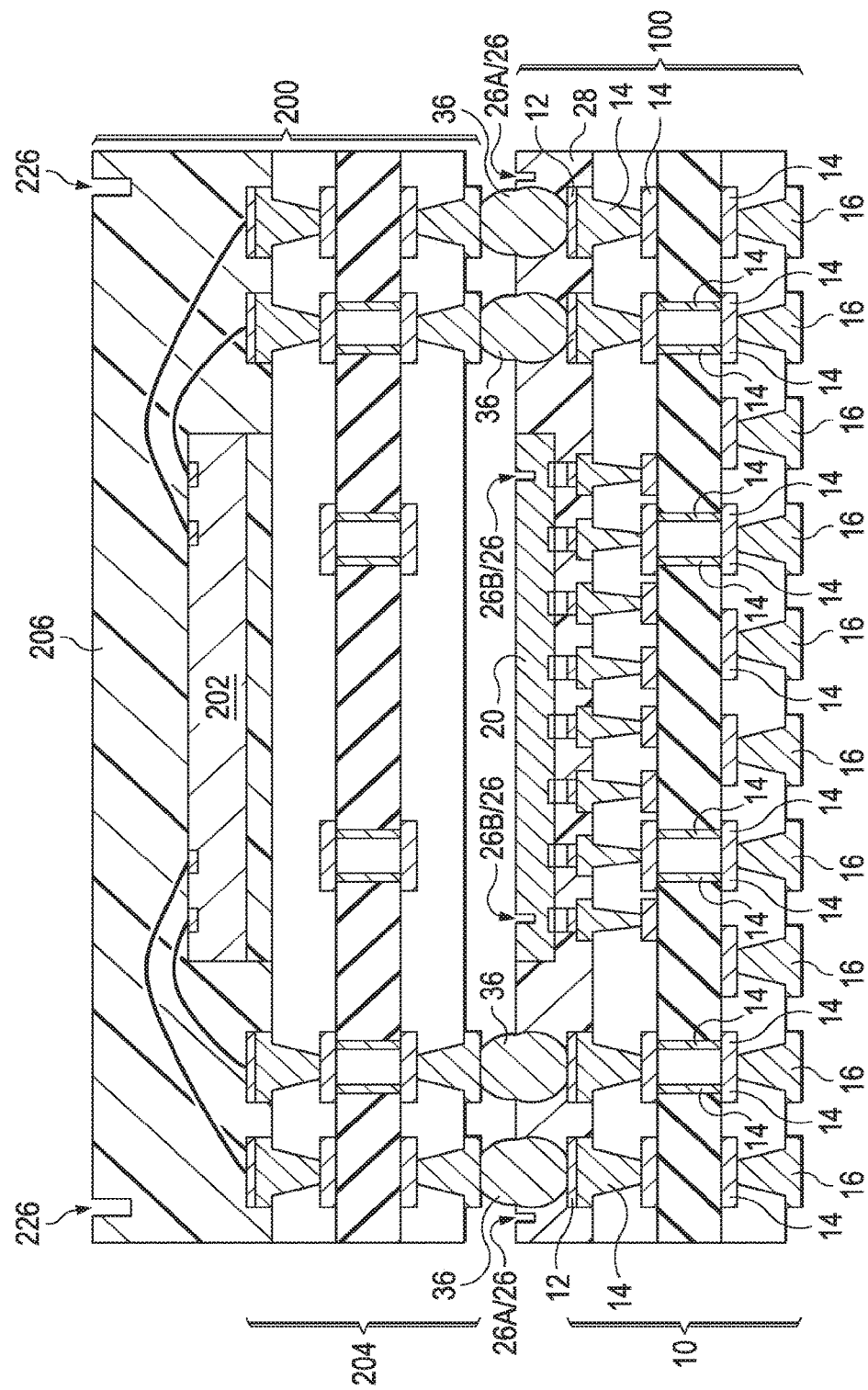
Figure 11A:
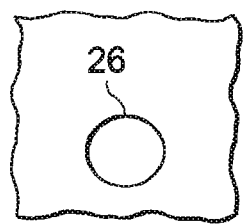
FIGS. 11A through 11I illustrate the top views of some exemplary alignment marks.
Figure 11B:
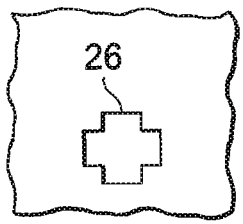
Figure 11C:
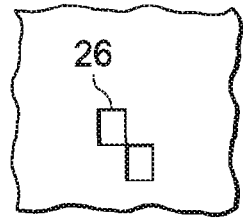
Figure 11D:
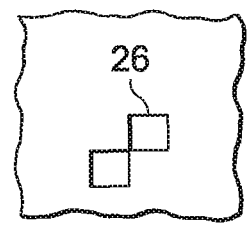
Figure 11E:
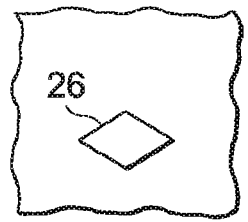
Figure 11F:
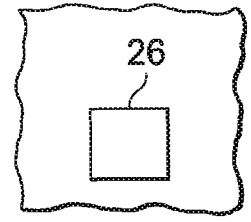
Figure 11G:
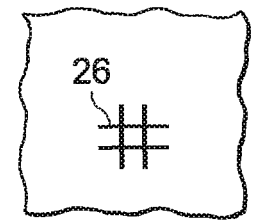
Figure 11H:
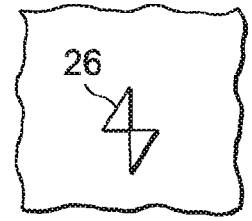
Figure 11I:
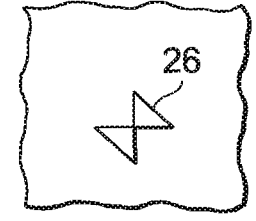

Next, the reflow boat 32 (FIGS. 7 and 8), bottom packages 100, and top packages 200 go through a reflow process, so that bottom packages 100 and the respective top packages 200 are bonded to form PoP structures. FIG. 10 illustrates a respective PoP structure. During the reflow, solder balls 208 and the solder in electrical connectors 24 (FIG. 9) are molten, and merge with each other to form solder regions 36 as in FIG. 10.

In the embodiments of the present disclosure, the alignment of electrical connectors such as solder regions are performed through the alignment marks made on the bottom package and/or the top package. The positions of the electrical connectors may thus be accurately determined. As a comparison, in conventional alignment processes, the alignment is performed through the alignment marks on reflow boats. The position of the bottom packages may shift relative to the alignment marks on the reflow boats, for example, due to the process variation in the cutting of bottom packages. The shift in the positions of the bottom packages, however, is not taken into account when the alignment is performed. The alignment accuracy in conventional alignment process is hence adversely affected.

In accordance with some embodiments, a method includes aligning a top package to a bottom package using an alignment mark in the bottom package, and placing the top package over the bottom package, wherein the top package is aligned to the bottom package after the placing the top package over the bottom package. A reflow is then performed to bond the top package to the bottom package.

In accordance with other embodiments, a method includes bonding a device die onto a package substrate to form a bottom package, dispensing a molding material to mold at least a lower portion of the device die in the molding material, and forming an alignment mark in at least one of the molding material and the device die.

In accordance with yet other embodiments, a package includes a device die over and bonded onto a package substrate, and a molding material molding at least a lower portion of the device die therein. The molding material is overlying the package substrate. A solder region is at a top surface of, and electrically coupled to, the package substrate. An alignment mark is at a top surface of one of the device die and the package substrate.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
   a bottom package comprising:
   a package substrate;
   a device die over and bonded to the package substrate;
   a molding material encapsulating at least a lower portion of the device die therein, wherein the molding material extends overlying the package substrate, wherein a top surface of the device die is exposed through the molding material;
   a solder region at a top surface of, and electrically coupled to, the package substrate, wherein the solder region comprises a lower portion in the molding material, and an upper portion protruding out of, and higher than, a planar top surface the molding material; and
   a first alignment mark at a top surface of the molding material, wherein an entirety of the first alignment mark is lower than the upper portion of the solder region; and
   a top package bonded to the solder region, wherein first sidewalls of the lower portion of the solder region are smooth and rounded, and second sidewalls of the upper portion of the solder region are smooth and rounded, and wherein the first sidewalls are joined to the second sidewalls with a discontinuity in smoothness, and the discontinuity is at a level substantially coplanar with the planar top surface of the molding material, wherein the top package further comprises:
   a second alignment mark extending from a top surface of the top package to an intermediate level of the top package;
   an additional device die; and
   an additional molding material encapsulating the additional device die, wherein the second alignment mark is formed in the additional molding material.

2. The package of claim 1, wherein the upper portion has a rounded top surface.

3. The package of claim 1, wherein the solder region is an edge solder region that is closest to an edge of the bottom package than all solder regions on the package substrate and at a same level as the edge solder region, and the first alignment mark is between the edge solder region and the edge of the bottom package.

4. The package of claim 1 further comprising a second alignment mark, wherein the second alignment mark further comprises an additional trench extending from the top surface of the device die into the device die.

5. The package of claim 4, wherein the additional trench is located at a corner of the device die.

6. The package of claim 1, wherein the first alignment mark comprises a trench extending from the top surface of the molding material into the molding material, and a top end of the first alignment mark is coplanar with the top surface of the device die.

7. A package comprising:
a package substrate;
a device die over and bonded to the package substrate;
a solder region physically joined to the package substrate, the solder region comprising:
   a lower portion having first sidewalls, wherein the first sidewalls are smooth and rounded;
   an upper portion comprising second sidewalls, wherein the second sidewalls are smooth and rounded, and wherein the first sidewalls and the second sidewalls are joined to each other with a discontinuity in smoothness;
a molding material molding the device die and the lower portion of the solder region therein, wherein the device die, the package substrate, and the molding material form a first package, wherein the upper portion of the solder region protrudes out of a planar top surface of the molding material, with a joint of the lower portion and the upper portion of the solder region being coplanar with the planar top surface of the molding material;
a first alignment mark extending into one of the device die and the molding material; and
a second package bonded to the first package through the solder region, wherein the second package comprises:
   an additional device die;
   an additional molding material encapsulating the additional device die; and
   a second alignment mark, wherein the second alignment mark is formed in the additional molding material.

8. The package of claim 7, wherein a top end of the first alignment mark is coplanar with the joint of the lower portion and the upper portion of the solder region.

9. The package of claim 7, wherein the first alignment mark comprises a trench extending into the device die.

10. The package of claim 9, wherein the trench of the first alignment mark is located at a corner of the device die.

11. The package of claim 7, wherein the planar top surface of the molding material is coplanar with a top surface of the device die.

12. The package of claim 7, wherein the first alignment mark is in the molding material, and the first alignment mark overlaps the device die.

13. The package of claim 7, wherein the first alignment mark is in the device die, and a portion of the first alignment mark is at a same level as a portion of the molding material.

14. A package comprising:
a package substrate;
a device die over and bonded to the package substrate;
a solder region comprising:
   bottom surface attached to the package substrate; and
   a continuously rounded surface comprising rounded top surfaces and rounded sidewalls;
an encapsulating material encapsulating the device die therein, wherein the encapsulating material comprises a top portion overlapping the device die; and
an alignment mark comprising a trench extending into the top portion of the encapsulating material.

15. The package of claim 14, wherein an entirety of the alignment mark is higher than the solder region.

16. The package of claim 14, wherein the rounded top surfaces of the solder region have a spherical shape.

17. The package of claim 14, wherein no package component is over and bonded to the solder region.

18. The package of claim 14 further comprising an additional alignment mark not overlapping the device die.

19. The package of claim 14, wherein the encapsulating material comprises an opening, and an entirety of the solder region is in the opening.

20. The package of claim 14, wherein the alignment mark is located at a corner of the package.

* * * * *